US012791948B2

(12) United States Patent
Kay et al.

(10) Patent No.: US 12,791,948 B2
(45) Date of Patent: Nov. 10, 2026

(54) SYSTEM AND METHOD FOR TRACKING PRODUCTION WORKFLOW INFORMATION OF DIGITAL PHOTOPOLYMER PRINTING PLATES

(71) Applicant: Esko-Graphics Imaging GmbH, Itzehoe (DE)

(72) Inventors: Nils Kay, Regensdorf (CH); Joachim Scheele, Regensdorf (CH); Sascha Holm, Regensdorf (CH); Koen Vangenechten, Regensdorf (CH)

(73) Assignee: Esko-Graphics Imaging GmbH, Itzehoe (DE)

( * ) Notice: Subject to any disclaimer, the term of this patent is extended or adjusted under 35 U.S.C. 154(b) by 0 days.

(21) Appl. No.: 19/132,264

(22) PCT Filed: Nov. 22, 2023

(86) PCT No.: PCT/IB2023/061812
§ 371 (c)(1),
(2) Date: May 22, 2025

(87) PCT Pub. No.: WO2024/110904
PCT Pub. Date: May 30, 2024

(65) Prior Publication Data

US 2026/0194827 A1 Jul. 9, 2026

(30) Foreign Application Priority Data

Nov. 23, 2022 (EP) .................................... 22209008

(51) Int. Cl.
*G03F 7/00* (2006.01)
*B41C 1/18* (2006.01)
(Continued)

(52) U.S. Cl.
CPC ............ *G03F 7/70541* (2013.01); *B41C 1/18* (2013.01); *B41M 5/24* (2013.01); *B41N 1/16* (2013.01); *B41N 3/003* (2013.01); *G06K 7/1439* (2013.01)

(58) Field of Classification Search
CPC ........ G03F 7/70541; B41C 1/18; B41M 5/24; B41N 1/16; B41N 3/003; G06K 7/1439
See application file for complete search history.

(56) References Cited

U.S. PATENT DOCUMENTS 4,403,548 A * 9/1983 Faller ........................ B41N 1/22 101/376
11,420,464 B2 8/2022 Barbier et al.
(Continued)

FOREIGN PATENT DOCUMENTS

WO 2021069489 A1 4/2021
WO 2022112342 A1 6/2022

OTHER PUBLICATIONS

International Search Report (PCT/ISA/210) and Written Opinion (PCT/ISA/237) mailed Apr. 2, 2024, by the European Patent Office as the International Searching Authority for International Application No. PCT/IB2023/061812. (9 pages).
(Continued)

*Primary Examiner* — David H Banh
(74) *Attorney, Agent, or Firm* — Buchanan Ingersoll & Rooney PC

(57) ABSTRACT

A process for manufacture of a flexographic printing plate pursuant to a plurality of process steps, including at least an imaging step, a curing step, a washing or other non-cured-polymer-removal step, each step performed by a processing machine having at least one variable operating parameter. The process includes providing a smart plate tracking (SPT) code on each flexographic printing plate, storing in computer memory instructions readable by a computer processor
(Continued)

information corresponding to the at least one variable operating parameter for each of the processing machines in association with the SPT code, and in response to receiving the SPT code as an input from a user or machine interface corresponding to one of the processing machines, the computer processor returning instructions corresponding to one of the processing machines.

17 Claims, 2 Drawing Sheets

(51) Int. Cl.

| | |
|---|---|
| ***B41M 5/24*** | (2006.01) |
| ***B41N 1/16*** | (2006.01) |
| ***B41N 3/00*** | (2006.01) |
| ***G06K 7/14*** | (2006.01) |

(56) References Cited

U.S. PATENT DOCUMENTS

| | | | | |
|---|---|---|---|---|
| 2014/0326152 | A1* | 11/2014 | Gartner | B41F 27/1268 101/477 |
| 2019/0351688 | A1 | 11/2019 | Sievers et al. | |
| 2020/0016916 | A1 | 1/2020 | Sievers et al. | |
| 2021/0174042 | A1 | 6/2021 | Sievers et al. | |
| 2021/0245542 | A1* | 8/2021 | Kaufmann | G06K 15/1836 |

OTHER PUBLICATIONS

Robertson, “Printing Processes, Inks, Adhesives and Labeling of Packaging Materials”, CRC Press, Jan. 2013, pp. 243-269, Third Edition.

* cited by examiner

SYSTEM AND METHOD FOR TRACKING PRODUCTION WORKFLOW INFORMATION OF DIGITAL PHOTOPOLYMER PRINTING PLATES

CROSS REFERENCE TO RELATED APPLICATIONS

This application is a United States National Phase applicatoin of PCT International Patent Application No. PCT/IB2023/061812, filed on Nov. 22, 2023, which claims priority to European Application No. 22209008.6, titled SYSTEM AND METHOD FOR TRACKING PRODUCTION WORKFLOW INFORMATION OF DIGITAL PHOTOPOLYMER PRINTING PLATES, filed Nov. 23, 2022, all of which are incorporated herein by reference in their entireties.

BACKGROUND OF THE INVENTION

The production of flexographic printing plates in a production site comprises several production steps, such as but not limited to:

1. Imaging
2. Main exposure (e.g. with UV-A radiation)
3. Removal of non-cured photopolymer
4. Drying
5. Aftertreatment (e.g. with UV-A and/or UV-C radiation)
6. Shipping Depending on the factory size, many plates of different brands, types, and production parameters may pass through the production lines during a typical day. To organize the workflow, many production sites dedicate job numbers for each plate they produce. These Job numbers may comprise several alphanumeric signs that may, or may not, reflect a customer name, date of order intake, and the like.

Often, job numbers together with processing instructions are written on one or more sheets of paper, which sometimes are collected in a map that accompanies the plate through the different production stages. Here all the important information about the job is written down. Dealing with dozens of sheets or maps is cumbersome and slows down the workflow speed, resulting in wasted time and paper, Operators make mistakes when reading the job processing information or mix up job numbers, which causes additional costs when plates need to be redone.

Exemplary systems and processes for tracking workflow of printing plates, and providing coding thereon, are described in published application Ser. Nos US20210174042A1, US20190351688A1, US20200016916A1, each of which is titled METHOD FOR PERSISTENT MARKING OF FLEXO PLATES WITH WORKFLOW INFORMATION AND PLATES MARKED THEREWITH, and in published application Ser. No, WO2021069489A1, titled SYSTEM AND PROCESS FOR PERSISTENT MARKING OF FLEXO PLATES AND PLATES MARKED THEREWITH, and in granted U.S. Pat. No. 11,420,464, titled PHOTOSENSITIVE PRINTING FORM FOR A FLEXOGRAPHIC PRINTING METHOD COMPRISING VISIBLE AND NON-PRINTABLE INFORMATION, AND METHOD FOR PREPARING SUCH A PRINTING FORM, all of which are incorporated herein by reference and are owned by the common assignee of this application. Commercially, certain embodiments covered by these inventions may be known as Esko® Plate ID™—a feature of Esko® Flexo Engine™ software, which is an option offered in connection with Esko® Automation Engine software. These subject patent applications, patent, and commercial embodiment are collectively referred to as "Plate ID," herein. One downside of Plate ID, in particular in those embodiments in which very small openings in the mask ultimately form machine-readable indicia formed of microdots on the plate, is that the indicia may be difficult to read at certain times during the plate manufacturing workflow (e.g. when disposed on the mask, after being imaged onto the plate prior to uncured polymer removal, and even at the stage before a drying step after a washing step that removes uncured polymer), thus creating a gap in the process.

Thus, there is an interest in closing the aforementioned gap, and a need for an improved, paperless, efficient workflow for printing plate manufacture.

SUMMARY OF THE INVENTION

One aspect of the invention relates to a process for manufacture of a flexographic printing plate, the process comprising a plurality of process steps, including at least an imaging step, a curing step, a washing or other non-cured-polymer-removal step, each step performed by a processing machine having at least one variable operating parameter. The process comprises providing a smart plate tracking (SPT) code on each flexographic printing plate, storing in a computer memory readable by a computer processor information including instructions corresponding to the at least one variable operating parameter for each of the processing machines in association with the SPT code, and in response to the computer processor receiving the SPT code as an input from a user or machine interface corresponding to one of the processing machines, returning the instructions to the user or machine interface corresponding to one of the processing machines. The SPT code may be combined with a technical pattern configured for analysis of imaging quality. The SPT code may be a reusable code having a maximum number of unique code values that is fewer than a total number of printing plates to be manufactured by a processing facility in a designated time period, the process comprising using a first instance of a first unique code value as the SPT code a first time for a first printing plate and using a second instance of the first unique code value as the SPT code a second time for a second printing plate after the designated time period elapses.

In embodiments, the flexographic plate may comprise a primary plate having a first unit area comprising a plurality of plate patches, the plurality of plate patches each having a second unit area smaller than the first unit area and configured to be separated from one another after manufacture of the primary flexographic printing plate. In such embodiments, each plate patch has a patch identification code that is a machine-readable unique code configured to provide readability downstream of the washing or other non-cured-polymer-removal step without printing in a printing step, and the SPT code is assigned to the primary plate and is different from and in a different format from the patch identification code. The process may further comprise linking the patch identification codes corresponding to each of the plurality of plate patches to information stored in computer memory in association with the SPT code.

The process may further include programming a selected processing machine using the at least one variable operating parameter. In some embodiment, the selected processing machine associated with one of the plurality of processing steps may be connected to the computer processor via the machine interface, wherein the machine interface automatically programs the selected processing machine with the at least one variable operating parameter received from the computer processor. In other embodiments, the selected processing machine associated with at least one of the plurality of processing steps may not be connected to the computer processor, wherein the SPT code is supplied by a human user via an input device and the instructions are received and communicated to the human user by an output device, wherein the human user manually enters the instructions into the selected processing machine.

The plurality of processing steps may further include a cutting step, in which the process may include prior to receiving the SPT code from a user interface, providing the computer processor with the instructions corresponding to the at least one variable operating parameter and storing the instructions corresponding to the at least one variable operating parameter in the computer memory in association with the SPT code. The step of providing the computer processor with the instructions may include obtaining the instructions via a code reader that reads the SPT code, retrieves information associated with the SPT code, and transmits the instructions to the computer processor. The step of providing the computer processor with the instructions may instead include a human operator entering the instructions via a data entry user interface or the computer processor may receive the instructions via a workflow automation program.

The process may further include receiving with the computer processor quality data corresponding to the primary printing plate, such as quality data received automatically from an instrument in communication with the computer processor or received via a user interface from a human operator. The quality data may be selected from the group consisting of: a photograph obtained via an image capture device, a photopolymer density, and a photopolymer thickness. The process may include receiving, from the computer processor as an output in response to receipt of the SPT code, a set of instructions identifying one or more quality parameters to measure, receiving via the user interface one or more measured values corresponding to the one or more quality parameters, and storing in the computer memory the measured values.

Providing the SPT code on each primary flexographic printing plate may include engraving the SPT code on a non-printing portion of the plate. Where the primary printing plate comprises a photopolymer plate with a Laser Ablatable Mask (LAMs) layer and the imager comprises a laser, engraving the SPT code may include using the laser to ablate a mask and a portion of the photopolymer.

Another aspect of the invention relates to a system for making a flexographic printing plate, the system comprising a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller. The system further includes means for providing a smart plate tracking (SPT) code on the flexographic printing plate, and a computer memory readable by a computer processor, the computer memory programmed with information including instructions corresponding to the at least one variable operating parameter for each of the processing machines in association with the SPT code. The computer processor is configured to receive the SPT code as an input and to return as an output instructions corresponding to the at least one operating parameter. The system further includes a user interface, or a machine interface corresponding to one of the processing machines, connected to the computer processor and configured to provide the SPT code as the input to the computer processor and to receive the output from the computer processor.

In embodiments, the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein each plate patch has a patch identification code configured for persistent readability downstream of the washing or other non-cured-polymer-removal and cutting steps without printing in a printing step.

The system may further comprise means for providing the patch identification code on each patch. In embodiments in which the primary printing plate comprises a photopolymer plate with a Laser Ablatable Mask (LAMs) layer and the imager comprises a laser, the imager may be programmed with instructions to create a pattern of microdots in the mask that resolve to non-printing dots above a floor of the plate and below a printing level of a finished printing plate in order to provide the patch identification code on each patch. In other embodiments, the means for providing the SPT code comprises the imager programmed with instructions to laser ablate the mask and a portion of the photopolymer to create the code.

The user interface may comprise a mobile device with a display configured to display the output from the computer processor in a human-readable format and the processing machine may be configured to receive a human-entered input in the human-readable format.

The machine interface corresponding to one of the processing machines may be configured to automatically provide the SPT code to the computer processor, automatically receive the output from the computer processor, and automatically implement the instructions corresponding to the at least one operating parameter on the one of the processing machines.

The plurality of processing machines may include at least a cutter configured to receive the SPT code and to cut the primary printing plate into the plate patches, and the instructions corresponding to the at least one operating parameter include cutting information for separating the plate patches from the primary printing plate and from one another. The cutter may have a user interface configured to receive the SPT code as a user input. The cutter may have a machine vision system configured to read the SPT code from the primary printing plate.

Still another aspect of the invention relates to non-transitory, machine-readable media embodied with machine-readable instructions readable by a computer processor for causing the processor to execute steps of a method for manufacturing a flexographic printing plate using a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller. The method comprising the steps of causing a smart plate tracking (SPT) code to be provided on the flexographic printing plate, storing in a computer memory readable by the computer processor information including instructions corresponding to the at least one variable operating parameter for each of the processing machines in association with at least the SPT code, and in response to the computer processor receiving the SPT code as an input from a user interface or a machine interface corresponding to one of the processing machines, returning the instructions to the user interface or the machine interface corresponding to one of the processing machines.

In embodiments directed to a flexographic printing plate comprising a primary plate having a first unit area comprising a plurality of plate patches, the plurality of plate patches each having a second unit area smaller than the first unit area and configured to be separated from one another after manufacture of the primary flexographic printing plate, the machine-readable instructions embodied on the media may further comprise instructions for causing a patch identification code to be provided on each plate patch, wherein the patch identification code comprises a machine-readable unique code configured to provide readability downstream of the washing or other non-cured-polymer-removal step without printing in a printing step.

In embodiments directed to a flexographic printing plate comprises a primary plate having a first unit area comprising a plurality of plate patches, the plurality of plate patches each having a second unit area smaller than the first unit area and configured to be separated from one another after manufacture of the primary flexographic printing plate, the machine-readable instructions embodied on the media may further comprise instructions for reading a unique patch identification code associated with each plate patch, and retrieving information associated with the patch identification code including the instructions corresponding to the at least one variable operating parameter for each of the processing machines.

The machine-readable instructions may include instructions for causing an imager comprising a laser to create a pattern of microdots in a Laser Ablatable Mask (LAMs) layer, the microdots configured to resolve to non-printing dots above a floor of the plate and below a printing level of a finished printing plate. The machine-readable instructions may include instructions for causing the imager to laser ablate the mask and a portion of the photopolymer to create the SPT code. The machine-readable instructions may include instructions for causing the user interface to display the output from the computer processor in a human-readable format. The machine-readable instructions may include instructions for providing cutting information to a cutter in response to receiving the SPT code. The machine-readable instructions may include instructions for performing a quality check operation including an identification of one or more parameters to measure, instructions for receiving input of one or more measured values corresponding to the one or more parameters, and instructions for storing the one or more measured values in the computer memory.

DETAILED DESCRIPTION OF THE INVENTION

One aspect of the invention relates to a system for automatically providing process parameters needed for production of digital photopolymer printing plates. The individual processing stages for producing the plate are in communication with a computer server. The server provides operation and handling instructions for the plate to be processed either directly to the processing stations or to the operator that operates the processing station. Additionally, the server provides information about the status of the plate in the production process.

Smart Plate Tracking (SPT) is a software-based method that helps tracking a photopolymer plate production job from the first production step—the imaging step—to the end of the production process when the plate is shipped or used in-house for printing. In certain applications, the photopolymer plate may comprise a multitude of printing job patches, wherein the SPT number refers to the complete plate and all patches on the plate.

Figure 1:
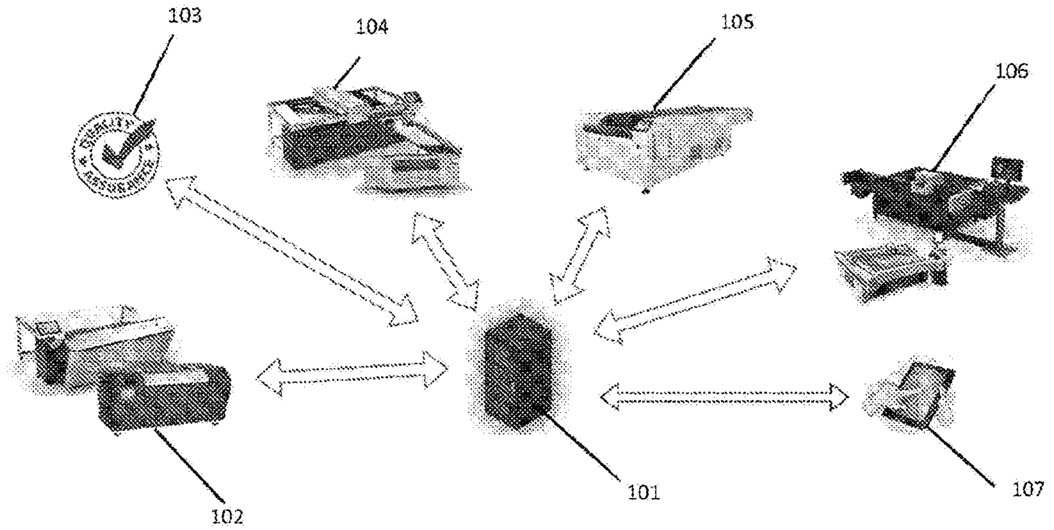
FIG. 1 is a schematic illustration of exemplary devices connected to a job tracking server.

Referring now to the figures, FIG. 1 shows a set of exemplary devices connected to the SPT server 101. Depicted devices include an imager 102, quality control instruments 103 (e.g. microscopes, cameras, densitometers, and the like), a main exposure device 104, a washing unit 105, a cutting table 106, and a handheld operator user interface 107.

While FIG. 1 shows an exemplary full integration of one exemplary workflow, some workflows may include more or fewer devices, and not all devices in a workflow are required to be in online data connection with the SPT server. In some embodiments, to track the job through all production stages, offline devices may be created virtually on the server. For example, embodiments may permit a user to connect to a webpage associated with the SPT server and add offline devices, such as but not limited to: a bank UV exposure unit, a solvent/fast processor, a dryer, a finisher, or the like.

Figure 2:
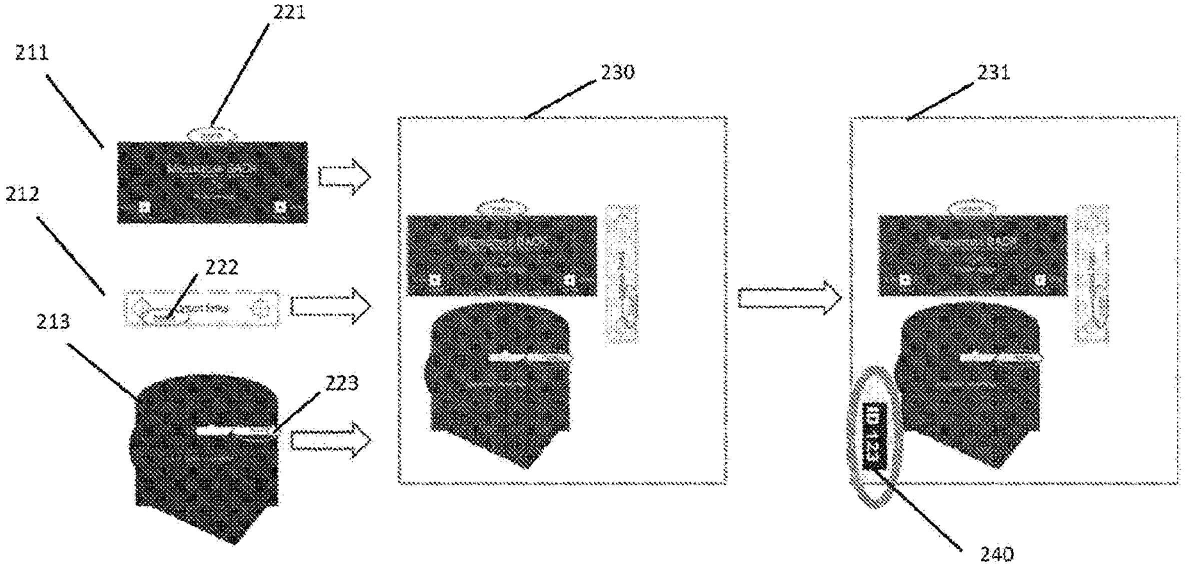
FIG. 2 is a schematic illustration of a relationship between a Plate ID code assigned to each plate patch and a SPT code assigned to a plate on which multiple plate patches reside prior to cutting.
Figure 3A:
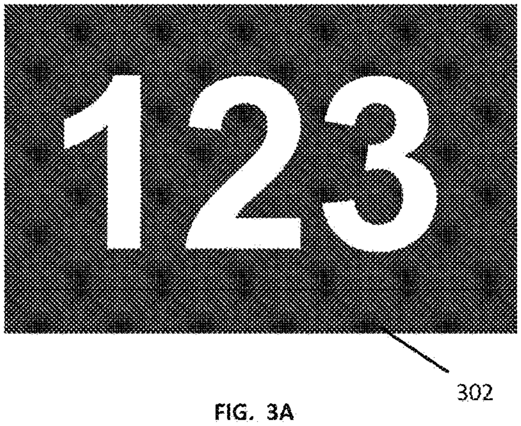
FIG. 3A is a schematic illustration of an exemplary SPT number in which the black area corresponds to a printing area of the plate.
Figure 3B:
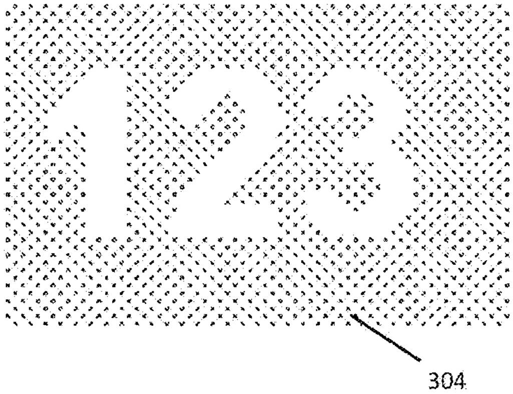
FIG. 3B is a schematic illustration of an alternate embodiment of an exemplary SPT number in which the area surrounding the number comprises a microscreen pattern. The printing/non-printing areas can be reversed.

In one embodiment, the tracking is realized by allocating a code (e.g. a three-digit number 240, 402, or the numbers defined by the printing areas 302 and 304 in FIGS. 3A and 3B, respectively) to every plate in production. The code may be, for example, imaged in the lower left corner of every plate (as shown in FIG. 2). The imaged code (shown in white in FIGS. 3A and 3B) may be defined as an area with a first elevation surrounded by second area 302 with a second, higher elevation (shown in black in FIG. 3A or 3B), which is preferably at a printing elevation, and which may be defined as a solid area 302 or by a microscreen 304 defined by a plurality of raised areas that together hold ink equivalent to or better than a solid area of the plate. The elevated/sunken areas may be reversed (e.g. the number 123 may be raised and surrounded by a relatively sunken region. Although not so limited, the raised area is preferably a printing area, for optimal visibility at certain stages in the printing plate creation workflow.

Figure 4:
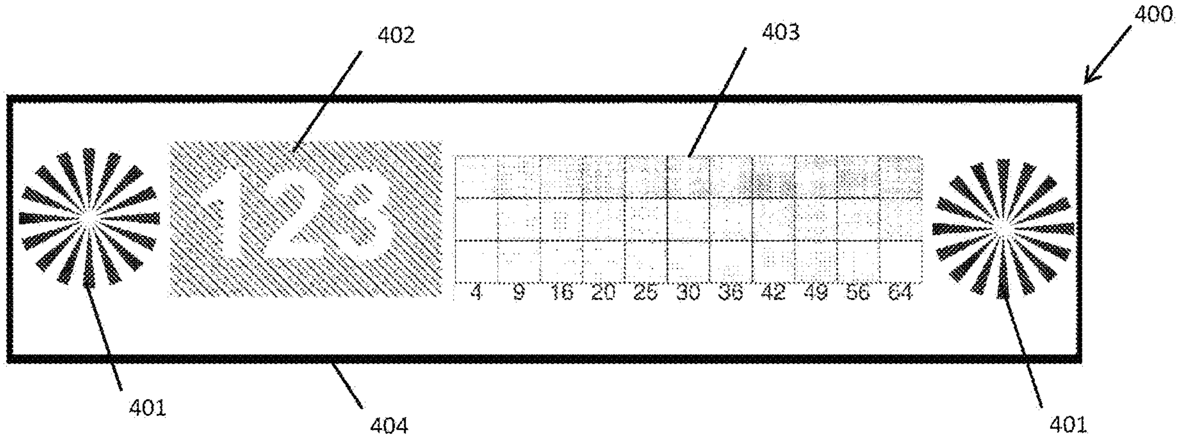
FIG. 4 is a schematic illustration of an exemplary test strip comprising an exemplary microscreen.

While not limited to any particular location, the SPT code is preferably located at a place on the plate typically reserved for technical images, such as a focus search image. The SPT code may be combined (e.g. overlaid) with a technical pattern configured for analysis of imaging quality for quality control purposes, such as a 50% image screen or a micro screen pattern. For example, as shown in FIG. 4, a test strip 400 may comprise one or more print marks 401, the SPT number 402 as defined by a surrounding microscreen (e.g. a MG34 Microscreen as shown) and a Dotfail test 403. Any type of micro-screens may be used, as may a simple image screen (e.g. a 142 LPI 22° 50% circular dot screen) or any other pattern suitable for creating a print area. The test strip arrangement may be surrounded by solid or patterned printing support strips (404). Notable, with respect to FIG. 4, the pixel size of the different components of the strip 400 are not to scale in order to improve visibility of the microscreen. The test strip is not limited to the elements depicted, which are exemplary only, and other elements may be included, such as but not limited to image screen patterns at various percentages, or a focus search.

Notably, while a plate manufacturing plant may produce far in excess of 999 units over a relatively long period of time, in most operations, a three-digit numeric code is sufficient to permit tracking on a daily or weekly basis. Of course, the code is not limited to a 3-digit numeric and can have more or fewer digits and/or may include alphabetical characters as well, in order to enable tracking more items before having to re-use the code. A fully unique code for every single plate is not required for manufacturing processes, however, as the tracking may only be desired for the maximum number of plates simultaneously in process. Using a relatively smaller code requires less memory than longer codes and takes up less space on the in-process plate.

An exemplary workflow may include the following steps:

1. Imager (e.g. an Esko® CDI™ imager).
   a. The operator loads the plate and starts the job.
   b. Info and status of the job is sent to the SPT server,
   c. The SPT server returns a unique code (e.g. 3-digit number) for the job.
   d. The imager engraves the code in a predetermined region (e.g. the lower left corner) of the plate.
   e. The job is completed.
   f. The imager sends info to SPT Server including the end time and status of the plate,
2. Exposure Unit (e.g. Esko® XPS™ UV exposure unit):
   a. The operator enters the code into a user interface of the exposure unit.
   b. Information about the job is loaded from the Smart Plate Tracking Server and displayed to the operator. OR
   c. The plate is preselected—in an automated workflow using workflow automation software (e.g. Esko® Digital Flexo Suite (DFS) software), the settings corresponding to the plate may be set automatically based on information from the workflow automation software as retained from step 1c, above.
   d. Operator commences the plate exposure step.
   e. Information about the job and status of the exposure unit is sent to the SPT Server (i.e. an "Exposure Job Start" notification).
   f. Plate is finished.
   g. Information about the job and status of the exposure unit is sent to the Smart Plate Tracking Server (i.e. a "Exposure Job Finish" notification). Additional steps may be included for downstream processing, such as for processes in which a cutting table is integrated in the workflow. For example:
3. Cutting Table:
   a. The operator enters the code into a user interface of the cutting table.
   b. Cutting information for the job is loaded from the SPT Server and displayed to the operator.
   c. Operator places the plate on cutting table and starts the cutting process,
   d. Information about the job and status of the cutting table is sent to the Smart Plate Tracking Server (i.e. a "Cutter Job Start" notification).
   e. Plate cutting is finished.
   f. Information about the job and status of the cutting table is sent to the Smart Plate Tracking Server (i.e. a "Cutter Job Finish" notification).

Upon receiving the Plate number as an input (e.g. from a human operator via a user interface or via a machine interface), the server returns the necessary production parameters of the plate for the corresponding device. For example, a bank exposure unit may have 20 different exposure programs, and a plate processor may process 30 different photopolymer plate types using one of these programs. Some programs work for more than one plate, whereas some are exclusively suitable for one type of plate. When, for example, the SPT number on the plate is entered by the operator into the handheld operator interface 106, the SPT server 101 sends the program number to be selected on the bank exposure unit 104 to expose the plate with the appropriate exposure parameters.

Additional processing steps may include a Quality Check 103, in which the instructions provided by the SPT may include what parameter(s) to measure and may include a user interface to facilitate input of the measurements. Target plate parameter values or ranges may be stored in memory and compared to measured values to determine whether the measured plate parameter value is acceptable. In some embodiments, a shipping department of the plate manufacturer may be connected to the SPT Server to produce shipping labels for the plates or portions thereof (i.e. plate patches), and send waybill information (i.e. shipping tracking numbers or codes, such as are issued by Federal Express, DHL, or the like) to the recipients. In some embodiments, the SPT number may be assigned at the order intake and associated with processing information (e.g. for the RIP), such as how many process colors are specified, what screen resolution to use, micro-screens to be applied, if any, and the like.

Integration of Offline Devices

In ideal embodiments, the SPT is integrated via a machine interface into each of the process machines (imager, exposure unit, cutter) used in production, such as where all units are relatively new units from the same manufacturer (e.g. Esko). In most real world systems, however, at least some equipment on the production site may be legacy equipment that is not capable of full integration into and online connection to the SPT server and is therefore unable to communicate directly with the SPT server. For example, older bank exposure units or plate processors are likely to typically have no online connection to the SPT server.

For such cases, the SPT system is configured to permit an operator to connect (e.g. with a mobile phone or tablet computer) to a webpage on the SPT Server and select an offline device from a list of offline devices. For these offline devices, operating parameters or program names can be initialized and linked to different photopolymer plate types. When the operator enters the SPT code into this webpage, the server will look up the plate type for the subject job and respond with the program number or name to be selected or executed on the offline device to process the plate with the subject code.

Depending on the type of device, the operator may also be guided to enter certain measurement results, such as mask opening parameters, images of the mask, mask density readings, and/or post-processing plate thickness. As is known in the art, mask density readings are typically made after imaging or UV-curing. Plate thickness is typically measured after the plate has been completely processed and dried. If deviations from target are found, this may signal incorrect parameter settings (e.g. wrong LAMS sensitivity chosen, insufficient drying time, incorrect amount of back exposure, etc.) or process equipment malfunction or wear (e.g. aging of radiation sources, such as fluorescent tubes on a bank exposer). Measurement and storage of such information may also be used to make production ISO 9000 compliant. This feature is visualized in FIG. 1 as quality assurance step 103.

Communication Between Units

The SPT server may typically be located in the same facility as the processing units, with communication between the units and the server over a local area network (LAN), For safety and confidentiality, the LAN on such a site is typically a private intranet with no connection to the public internet, but topologies including servers outside the facility via a virtual private network (VPN) over a public network are also feasible.

The operator connection to the server webpage may be established using a standard mobile device, such as a tablet computer or a mobile phone. Preferred embodiments may require no special application software, but rather a simple web browser on the device may be configured to open a link to the SPT server, where the information about status and processing instructions can be gathered. Entry of the code by an operator prompts a return of the information or instructions. For safety and security, mobile devices may connect through a local wireless LAN (WLAN).

Plate Numbering and Identification

As described herein, although the coding of the plates in a preferred implementation may have only 3 digits, which recur after 999 plates, the SPT server may internally be configured to understand and use unique IDs, such that every production or quality parameter can be allocated to a unique printing plate, such as in Plate ID embodiments as referenced herein. Whereas the Plate ID system, as described, is intended to provide information about each printing plate patch during the entire plate lifetime at every place the plate or patch might be in use, including mounting stations, printing presses, and plate storage facilities, the SPT system is designed for use inside the plate production facility for identification of the complete polymer sheet (which may contain multiple patches for multiple jobs).

The relationship between Plate ID and SPT is visualized in FIG. 2. Elements 201, 202 and 203 represent three different printing plate patches to be imaged, cured, and processed on one sheet of photopolymer 230. Each printing plate patch has a unique non-printing Plate ID 211, 212, and 213, which was allocated and implemented during the RIPping process into the image files of the individual plate patches. These three individual plate patch image files are imaged all together on one sheet of photopolymer 231 together with the 3-digit job tracking number 240. So, this interface between the Plate ID and SPT systems permits tracking and parameter delivery of a single plate on which multiple Plate ID patches reside.

This SPT code may also then be entered at the cutting table so that the cutting information is assigned to this specific sheet. Generally, even very large trade shops have only a very limited number of plates (e.g. 10) to be cut within the period of time for which tracking is desired (e.g. a day) the possibilities of which job is associated with each plate are limited. However, placing a ready-to-cut plate on the cutting table with the SPT code thereon allows checking a known position of each plate (similar to position detection on a plate handler) and scanning the spot where the SPT code is expected to be found. Each sheet has a limited number of possibilities where the code will be found: in the expected location with the plate in a correct orientation, with the plate upside down, and with 180° rotations of the plate from correct or upside down orientations.

In some embodiments, a cutting table may be configured to communicate with the SPT tracking software (e.g. a cutting table manufacturer may procure a license to the SPT software), which may permit the cutting table to load the cut-file associated with a plate based upon an operator manually entering the SPT code or based upon a machine vision system reading the value associated with the SPT code and transmitting the information automatically. The expected location on each plate for the SPT code may be pre-programmed into the cutting table based upon a standard location and possible orientations of the plate. The machine vision system may be any such system known in the art, typically comprising an image capture device and a computer processor configured to read information from the captured image, such as using optical character recognition software to determine the value corresponding to the SPT code from a captured image of the code embodied on a plate.

In summary, aspects of the invention as described herein include:

Aspect 1. A process for manufacture of a flexographic printing plate, the process comprising a plurality of process steps, including at least an imaging step, a curing step, a washing or other non-cured-polymer-removal step, each step performed by a processing machine having at least one variable operating parameter, the process comprising:

- providing a smart plate tracking (SPT) code on each flexographic printing plate;
- storing in a computer memory readable by a computer processor information including instructions corresponding to the at least one variable operating parameter for each of the processing machines in association with the SPT code; and
- in response to the computer processor receiving the SPT code as an input from a user or machine interface corresponding to one of the processing machines, returning the instructions to the user or machine interface corresponding to one of the processing machines.

Aspect 2. The process of aspect 1, wherein the flexographic plate comprises a primary plate having a first unit area comprising a plurality of plate patches, the plurality of plate patches each having a second unit area smaller than the first unit area and configured to be separated from one another after manufacture of the primary flexographic printing plate, and each plate patch has a patch identification code that is a machine-readable unique code configured to provide readability downstream of the washing or other non-cured-polymer-removal step without printing in a printing step, and wherein the SPT code is assigned to the primary plate and is different from and in a different format from the patch identification code.

Aspect 3. The process of aspect 2, further comprising linking the patch identification codes corresponding to each of the plurality of plate patches to information stored in computer memory in association with the SPT code.

Aspect 4. The process of any of the foregoing aspects, further comprising programming a selected processing machine using the at least one variable operating parameter.

Aspect 5. The process of aspect 4, wherein the selected processing machine associated with one of the plurality of processing steps is connected to the computer processor via the machine interface, and the machine interface automatically programs the selected processing machine with the at least one variable operating parameter received from the computer processor.

Aspect 6. The process of aspect 4, wherein the selected processing machine associated with at least one of the plurality of processing steps is not connected to the computer processor, wherein the SPT code is supplied by a human user via an input device and the instructions are received and communicated to the human user by an output device, wherein the human user manually enters the instructions into the selected processing machine.

Aspect 7. The process of any one of the foregoing aspects, wherein the SPT code is a reusable code having a maximum number of unique code values that is fewer than a total number of printing plates to be manufactured by a processing facility in a designated time period, the process comprising using the SPT code a first time for a first primary printing plate and using the SPT code a second time for a second primary printing plate after the designated time period elapses.

Aspect 8. The process of any one of the foregoing aspects, wherein the plurality of processing steps includes a cutting step.

Aspect 9. The process of aspect 8, comprising prior to receiving the SPT code from a user interface, providing the computer processor with the instructions corresponding to the at least one variable operating parameter and storing the instructions corresponding to the at least one variable operating parameter in the computer memory in association with the SPT code.

Aspect 10, The process of aspect 8, wherein the step of providing the computer processor with the instructions comprises obtaining the instructions via a code reader that reads the SPT code, retrieves information associated with the SPT code, and transmits the instructions to the computer processor.

Aspect 11. The process of aspect 8, wherein the step of providing the computer processor with the instructions comprises a human operator entering the instructions via a data entry user interface.

Aspect 12. The process of aspect 8, wherein the step of providing the computer processor with the instructions comprises the computer processor receiving the instructions via a workflow automation program.

Aspect 13. The process of any one of the foregoing aspects, further comprising receiving with the computer processor quality data corresponding to the primary printing plate.

Aspect 14. The process of aspect 13, wherein the quality data is received automatically from an instrument in communication with the computer processor.

Aspect 15. The process of aspect 13, wherein the quality data is received via a user interface from a human operator.

Aspect 16, The process of aspect 13, wherein the quality data is selected from the group consisting of: a photograph obtained via an image capture device, a photopolymer density, and a photopolymer thickness.

Aspect 17, The process of aspect 13, wherein the process includes receiving, from the computer processor as an output in response to receipt of the SPT code, a set of instructions identifying one or more quality parameters to measure, receiving via the user interface one or more measured values corresponding to the one or more quality parameters, and storing in the computer memory the measured values.

Aspect 18. The process of any one of the foregoing aspects, wherein providing the SPT code on each primary flexographic printing plate comprises engraving the SPT code on a non-printing portion of the plate.

Aspect 19. The process of aspect 18, wherein the primary printing plate comprises a photopolymer plate with a Laser Ablatable Mask (LAMs) layer, and the imager comprises a laser, wherein engraving the SPT code includes using the laser to ablate a mask and a portion of the photopolymer.

Aspect 20, The process of any one of the foregoing aspects, comprising combining the SPT code with a technical pattern configured for analysis of imaging quality.

Aspect 21, A system for making a flexographic printing plate, the system comprising:

- a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller;
- means for providing a smart plate tracking (SPT) code on the flexographic printing plate;
- a computer memory readable by a computer processor, the computer memory programmed with information including instructions corresponding to the at least one variable operating parameter for each of the processing machines in association with the SPT code, the computer processor configured to receive the SPT code as an input and to return as an output instructions corresponding to the at least one operating parameter; and
- a user interface, or a machine interface corresponding to one of the processing machines, the user interface or machine interface corresponding to one of the processing machines connected to the computer processor and configured to provide the SPT code as the input to the computer processor and to receive the output from the computer processor.

Aspect 22, The system of aspect 21, wherein the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein each plate patch has a patch identification code configured for persistent readability downstream of the washing or other non-cured-polymer-removal and cutting steps without printing in a printing step.

Aspect 23. The system of aspect 22, further comprising means for providing the patch identification code on each patch.

Aspect 24. The system of aspect 23, wherein the primary printing plate comprises a photopolymer plate with a Laser Ablatable Mask (LAMs) layer, and the imager comprises a laser, wherein the means for providing the patch identification code on each patch comprises the imager programmed with instructions to create a pattern of microdots in the mask that resolve to non-printing dots above a floor of the plate and below a printing level of a finished printing plate.

Aspect 25, The system of aspect 24, wherein the means for providing the SPT code comprises the imager programmed with instructions to laser ablate the mask and a portion of the photopolymer to create the code.

Aspect 26, The system of any one of aspects 21-25, wherein the user interface comprises a mobile device with a display configured to display the output from the computer processor in a human-readable format and the processing machine is configured to receive a human-entered input in the human-readable format.

Aspect 27. The system of any one of aspects 21-25, wherein the machine interface corresponding to one of the processing machines is configured to automatically provide the SPT code to the computer processor, automatically receive the output from the computer processor, and automatically implement the instructions corresponding to the at least one operating parameter on the one of the processing machines.

Aspect 28. The system of aspect 22, wherein the plurality of processing machines includes at least a cutter configured to cut the primary printing plate into the plate patches, the cutter configured to receive the SPT code, and the instructions corresponding to the at least one operating parameter include cutting information for separating the plate patches from the primary printing plate and from one another.

Aspect 29, The system of aspect 28, wherein the cutter has a user interface configured to receive the SPT code as a user input.

Aspect 30, The system of aspect 28, wherein the cutter has a machine vision system configured to read the SPT code from the primary printing plate.

Aspect 31, Non-transitory, machine-readable media embodied with machine-readable instructions readable by a computer processor for causing the processor to execute steps of a method for manufacturing a flexographic printing plate using a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller, the method comprising the steps of:

- causing a smart plate tracking (SPT) code to be provided on the flexographic printing plate;
- storing in a computer memory readable by the computer processor information including instructions corresponding to the at least one variable operating parameter for each of the processing machines in association with at least the SPT code; and
- in response to the computer processor receiving the SPT code as an input from a user interface or a machine interface corresponding to one of the processing machines, returning the instructions to the user interface or the machine interface corresponding to one of the processing machines.

Aspect 32. The non-transitory, machine-readable media of aspect 31, wherein the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein the machine-readable instructions embodied on the media further comprise instructions for causing a patch identification code to be provided on each plate patch, the patch identification code comprising a machine-readable unique code configured to provide readability downstream of the washing or other non-cured-polymer-removal step without printing in a printing step.

Aspect 33, The non-transitory, machine-readable media of aspects 31 or 32, wherein the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein the machine-readable instructions embodied on the media further comprise instructions for reading a unique patch identification code associated with each plate patch, and retrieving information associated with the patch identification code including the instructions corresponding to the at least one variable operating parameter for each of the processing machines.

Aspect 34, The non-transitory, machine-readable media of any one of aspects 31-33, wherein the machine-readable instructions embodied on the media include instructions for causing an imager comprising a laser to create a pattern of microdots in a Laser Ablatable Mask (LAMs) layer, the microdots configured to resolve to non-printing dots above a floor of the plate and below a printing level of a finished printing plate.

Aspect 35. The non-transitory, machine-readable media of aspect 34, wherein the machine-readable instructions embodied on the media include instructions for causing the imager to laser ablate the mask and a portion of the photopolymer to create the SPT code.

Aspect 36. The non-transitory, machine-readable media of any one of aspects 31-35, wherein the machine-readable instructions embodied on the media include instructions for causing the user interface to display the output from the computer processor in a human-readable format.

Aspect 37, The non-transitory, machine-readable media of any one of aspects 31-36, wherein the plurality of processing machines includes a cutter configured to cut the primary printing plate into the plate patches, and the machine-readable instructions embodied on the media include instructions for providing cutting information to the cutter in response to receiving the SPT code.

Aspect 38. The non-transitory, machine-readable media of any one of aspects 31-37, wherein the machine-readable instructions embodied on the media include instructions for performing a quality check operation including an identification of one or more parameters to measure, instructions for receiving input of one or more measured values corresponding to the one or more parameters, and instructions for storing the one or more measured values in the computer memory.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A process for manufacture of a flexographic printing plate, the process comprising a plurality of process steps, including at least an imaging step, a curing step, a washing or other non-cured-polymer-removal step, each step performed by a processing machine having at least one variable operating parameter, the process comprising:

- providing a smart plate tracking (SPT) code on each flexographic printing plate, wherein the SPT code is a reusable code having a maximum number of unique code values that is fewer than a total number of printing plates to be manufactured by a processing facility in a designated time period, including using a first instance of a first unique code value as the SPT code a first time for a first printing plate and using a second instance of the first unique code value as the SPT code a second time for a second printing plate after the designated time period elapses;
- storing in a computer memory readable by a computer processor information including instructions corresponding to the at least one variable operating parameter for each of the processing machines in association with the SPT code; and in response to the computer processor receiving the SPT code as an input from a user or machine interface corresponding to one of the processing machines, returning the instructions to the user or machine interface corresponding to one of the processing machines.

2. The process of claim 1, wherein the flexographic plate comprises a primary plate having a first unit area comprising a plurality of plate patches, the plurality of plate patches each having a second unit area smaller than the first unit area and configured to be separated from one another after manufacture of the primary flexographic printing plate, and each plate patch has a patch identification code that is a machine-readable unique code configured to provide readability downstream of the washing or other non-cured-polymer-removal step without printing in a printing step, and wherein the SPT code is assigned to the primary plate and is different from and in a different format from the patch identification code.

3. The process of claim 1, further comprising linking the patch identification codes corresponding to each of the plurality of plate patches to information stored in computer memory in association with the SPT code.

4. The process of claim 1, further comprising programming a selected processing machine using the at least one variable operating parameter, optionally including at least one of:

wherein the selected processing machine associated with one of the plurality of processing steps is connected to the computer processor via the machine interface, and the machine interface automatically programs the selected processing machine with the at least one variable operating parameter received from the computer processor; and wherein the selected processing machine associated with at least one of the plurality of processing steps is not connected to the computer processor, wherein the SPT code is supplied by a human user via an input device and the instructions are received and communicated to the human user by an output device, wherein the human user manually enters the instructions into the selected processing machine.

5. The process of claim 1, wherein the plurality of processing steps includes a cutting step, optionally including one or more of:

prior to receiving the SPT code from a user interface, providing the computer processor with the instructions corresponding to the at least one variable operating parameter and storing the instructions corresponding to the at least one variable operating parameter in the computer memory in association with the SPT code;

wherein the step of providing the computer processor with the instructions comprises obtaining the instructions via a code reader that reads the SPT code, retrieves information associated with the SPT code, and transmits the instructions to the computer processor;

wherein the step of providing the computer processor with the instructions comprises a human operator entering the instructions via a data entry user interface; and wherein the step of providing the computer processor with the instructions comprises the computer processor receiving the instructions via a workflow automation program.

6. The process of claim 1, further comprising receiving with the computer processor quality data corresponding to the primary printing plate, optionally including one or more of:

wherein the quality data is received automatically from an instrument in communication with the computer processor wherein the quality data is received via a user interface from a human operator;

wherein the quality data is selected from the group consisting of: a photograph obtained via an image capture device, a photopolymer density, and a photopolymer thickness; and wherein the process includes receiving, from the computer processor as an output in response to receipt of the SPT code, a set of instructions identifying one or more quality parameters to measure, receiving via the user interface one or more measured values corresponding to the one or more quality parameters, and storing in the computer memory the measured values.

7. The process of claim 1, wherein providing the SPT code on each primary flexographic printing plate comprises engraving the SPT code on a non-printing portion of the plate, including optionally, wherein the primary printing plate comprises a photopolymer plate with a Laser Ablatable Mask (LAMs) layer, and the imager comprises a laser, wherein engraving the SPT code includes using the laser to ablate a mask and a portion of the photopolymer.

8. The process of claim 1, comprising combining the SPT code with a technical pattern configured for analysis of imaging quality.

9. A system for making a flexographic printing plate, the system comprising:

a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller;

means for providing a smart plate tracking (SPT) code on the flexographic printing plate, wherein the SPT code is a reusable code having a maximum number of unique code values that is fewer than a total number of printing plates to be manufactured by a processing facility in a designated time period, wherein the means are configured to provide a first instance of a first unique code value as the SPT code a first time for a first printing plate and to provide a second instance of the first unique code value as the SPT code a second time for a second printing plate after the designated time period elapses;

a computer memory readable by a computer processor, the computer memory programmed with information including instructions corresponding to the at least one variable operating parameter for each of the processing machines in association with the SPT code, the computer processor configured to receive the SPT code as an input and to return as an output instructions corresponding to the at least one operating parameter; and a user interface, or a machine interface corresponding to one of the processing machines, the user interface or machine interface corresponding to one of the processing machines connected to the computer processor and configured to provide the SPT code as the input to the computer processor and to receive the output from the computer processor.

10. The system of claim 9, wherein the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein each plate patch has a patch identification code configured for persistent readability downstream of the washing or other non-cured-polymer-removal and cutting steps without printing in a printing step.

11. The system of claim 9, further comprising means for providing the patch identification code on each patch, including:

optionally, wherein the primary printing plate comprises a photopolymer plate with a Laser Ablatable Mask (LAMs) layer, and the imager comprises a laser, wherein the means for providing the patch identification code on each patch comprises the imager programmed with instructions to create a pattern of microdots in the mask that resolve to non-printing dots above a floor of the plate and below a printing level of a finished printing plate; and optionally, wherein the means for providing the SPT code comprises the imager programmed with instructions to laser ablate the mask and a portion of the photopolymer to the code.

12. The system of claim 9, wherein at least one of:

the user interface comprises a mobile device with a display configured to display the output from the computer processor in a human-readable format and the processing machine is configured to receive a human-entered input in the human-readable format; and the machine interface corresponding to one of the processing machines is configured to automatically provide the SPT code to the computer processor, automatically receive the output from the computer processor, and automatically implement the instructions corresponding to the at least one operating parameter on the one of the processing machines.

13. The system of claim 9, wherein the plurality of processing machines includes at least a cutter configured to cut the primary printing plate into the plate patches, the cutter configured to receive the SPT code, and the instructions corresponding to the at least one operating parameter include cutting information for separating the plate patches from the primary printing plate and from one another, including:

optionally, wherein the cutter has a user interface configured to receive the SPT code as a user input; and optionally, wherein the cutter has a machine vision system configured to read the SPT code from the primary printing plate.

14. Non-transitory, machine-readable media embodied with machine-readable instructions readable by a computer processor for causing the processor to execute steps of a method for manufacturing a flexographic printing plate using a plurality of processing machines, each processing machine configured to perform one or more process steps in a workflow, the workflow including at least an imaging step, a curing step, and a non-cured-polymer-removal step, each processing machine having a controller and at least one variable operating parameter controlled by the controller, the method comprising the steps of:

causing a smart plate tracking (SPT) code to be provided on the flexographic printing plate, wherein the SPT code is a reusable code having a maximum number of unique code values that is fewer than a total number of printing plates to be manufactured by a processing facility in a designated time period, including causing a first instance of a first unique code value to be provided as the SPT code a first time for a first printing plate and a second instance of the first unique code value to be provided as the SPT code a second time for a second printing plate after the designated time period elapses;

storing in a computer memory readable by the computer processor information including instructions corresponding to the at least one variable operating parameter for each of the processing machines in association with at least the SPT code; and in response to the computer processor receiving the SPT code as an input from a user interface or a machine interface corresponding to one of the processing machines, returning the instructions to the user interface or the machine interface corresponding to one of the processing machines.

15. The non-transitory, machine-readable media of claim 14, wherein the flexographic printing plate comprises a primary plate having a first unit area comprising a plurality of plate patches, the plurality of plate patches each having a second unit area smaller than the first unit area and configured to be separated from one another after manufacture of the primary flexographic printing plate, wherein the machine-readable instructions embodied on the media further comprise instructions for at least one of:

causing a patch identification code to be provided on each plate patch, the patch identification code comprising a machine-readable unique code configured to provide readability downstream of the washing or other non-cured-polymer-removal step without printing in a printing step; and reading a unique patch identification code associated with each plate patch, and retrieving information associated with the patch identification code including the instructions corresponding to the at least one variable operating parameter for each of the processing machines.

16. The non-transitory, machine-readable media of claim 14, wherein the machine-readable instructions embodied on the media include instructions for causing an imager comprising a laser to create a pattern of microdots in a Laser Ablatable Mask (LAMs) layer, the microdots configured to resolve to non-printing dots above a floor of the plate and below a printing level of a finished printing plate, including optionally, wherein the machine-readable instructions embodied on the media include instructions for causing the imager to laser ablate the mask and a portion of the photopolymer to create the SPT code.

17. The non-transitory, machine-readable media of claim 14, wherein at least one of:

the machine-readable instructions embodied on the media include instructions for causing the user interface to display the output from the computer processor in a human-readable format;

the plurality of processing machines includes a cutter configured to cut the primary printing plate into the plate patches, and the machine-readable instructions embodied on the media include instructions for providing cutting information to the cutter in response to receiving the SPT code; and the machine-readable instructions embodied on the media include instructions for performing a quality check operation including an identification of one or more parameters to measure, instructions for receiving input of one or more measured values corresponding to the one or more parameters, and instructions for storing the one or more measured values in the computer memory.

* * * * *